United States Patent [19]

Shrinkle

[11] Patent Number: 5,504,790
[45] Date of Patent: Apr. 2, 1996

[54] DIGITAL DATA PHASE DETECTOR

[75] Inventor: Louis J. Shrinkle, Leucadia, Calif.

[73] Assignee: Conner Peripherals, Inc., San Jose, Calif.

[21] Appl. No.: 353,553

[22] Filed: Dec. 9, 1994

[51] Int. Cl.$^6$ ................................................. H03L 7/091
[52] U.S. Cl. .................. 377/43; 327/9; 327/12; 327/241; 327/236; 331/1 A
[58] Field of Search ........................... 327/241, 242, 327/9, 12, 236, 42; 377/43; 331/1 A

[56] References Cited

U.S. PATENT DOCUMENTS

| | | | |
|---|---|---|---|
| 3,839,599 | 10/1974 | Pitroda | 327/242 |
| 4,090,145 | 5/1978 | Webb | 327/9 |
| 4,180,778 | 12/1979 | Worthington | 327/242 |
| 4,774,479 | 9/1988 | Tateishi | 331/1 A |
| 4,952,883 | 8/1990 | Enomoto et al. | 377/43 |
| 5,241,567 | 8/1993 | Shimakata | 327/42 |
| 5,311,178 | 5/1994 | Pan et al. | 341/360 |
| 5,432,480 | 7/1995 | Popescu | 327/236 |

OTHER PUBLICATIONS

Dolivo et al., *Fast Timing Recovery For Partial-Response Signaling Systems*, IBM Research Division, Zurich Research Laboratory, 1989 IEEE, pp. 0573–0577.

Wood et al., *Viterbi Detection of Class IV Partial Response on a Magnetic Recording Channel*, IEEE Transactions on Communications, vol. COM–34, No. 5, May 1986, pp. 454–461.

Cideciyan et al., *A PRML system for Digital Magnetic Recording*, IEEE Journal on Selected Areas in Communications, vol. 10, No. 1, Jan. 1992, pp. 38–56.

*Primary Examiner*—John S. Heyman
*Attorney, Agent, or Firm*—Fliesler, Dubb, Meyer & Lovejoy

[57] ABSTRACT

A digital phase detector that stores four sequential digital samples in a shift register. The contents of the shift register is evaluated at one half the clock frequency which generated the digital samples. The digital phase detectors predicts what the value should be for each of the two middle samples in the shift register. The predicted value and the actual value of each middle are used to generated a correction signal. The correction signals for the two middle samples are then added to produce a total correction signal which is to be used in controlling the phase and frequency of the voltage controlled oscillator in the phase locked loop generating the clock that controls the generation of the digital samples.

13 Claims, 4 Drawing Sheets

| SEQUENCE Ya Yb Yc OR Yb Yc Yd | SLOPE | ENCODED Ma La Mc Lc OR Mb Lb Md Ld | TESTED BY NOR | CORRECTION CALCULATION |
|---|---|---|---|---|
| 0  1  1 |  | 0 1 1 1 | 106 |  |
| -1 1  1 | NEG | 0 0 1 1 | 106 | 1 - Y |
| -1 1  0 |  | 0 0 0 1 | 106 |  |
| 0 -1  1 |  | 0 1 1 1 | 106 |  |
| -1 -1 1 | NEG | 0 0 1 1 | 106 | (-1) - Y |
| -1 -1 0 |  | 0 0 0 1 | 104 |  |
| -1 0  1 |  | 0 0 1 1 | 106 |  |
| 0  0  1 | NEG | 0 1 1 1 | 106 | 0 - Y |
| -1 0  0 |  | 0 0 0 1 | 104 |  |
| 0  1 -1 |  | 0 1 0 0 | 109 |  |
| 1  1 -1 | POS | 1 1 0 0 | 101 | Y - 1 |
| 1  1  0 |  | 1 1 0 1 | 101 |  |
| 0 -1 -1 |  | 0 1 0 0 | 109 |  |
| 1 -1 -1 | POS | 1 1 0 0 | 101 | Y - (-1) |
| 1 -1  0 |  | 1 1 0 1 | 101 |  |
| 1  0 -1 |  | 1 1 0 0 | 101 |  |
| 0  0 -1 | POS | 0 1 0 0 | 109 | Y - 0 |
| 1  0  0 |  | 1 1 0 1 | 101 |  |
| ALL OTHERS |  |  | OR 102 = 0 | 0 |

DIGITAL DATA PHASE DETECTOR

CROSS-REFERENCE TO RELATED APPLICATIONS

APPARATUS AND METHOD FOR CONTROLLING THE FREQUENCY AT WHICH DATA IS WRITTEN IN A DISK DRIVE SYSTEM, Ser. No. 08/352,545, filed Dec. 9, 1994, assigned to the assignee of the present application; and APPARATUS FOR COMPENSATING FOR NON-LINEAR CHARACTERISTICS OF MAGNETORESISTIVE HEADS, Ser. No. 08/353,681, filed Dec. 9, 1994, assigned to the assignee of the present application.

The above cross referenced patent applications are hereby incorporated by reference as if fully set forth herein.

BACKGROUND OF THE INVENTION

The present invention is generally related to digital phase locked loops for controlling the frequency and phase of a clock. In particular, the present invention relates to digital generating an error signal from data being recovered from a storage system to be used in controlling the frequency and phase of a clock in the storage system.

The use of phase locked loops to control the frequency and phase of a clock in storage systems is well known and understood in the art. In such systems as magnetic disk drive systems and magnetic tape system, phase lock loops are used to control the frequency and phase of a voltage controlled oscillator as a function of signals read from the magnetic media. The output of the voltage controlled oscillator is the clock which is used to recover data from the signals read from the magnetic media.

Generally, the disk drive system records data on the magnetic media in the form of data blocks or sectors. The data blocks or sectors are usually formatted with a preamble field including synchronization data and then a data field including the data. The length of the data field is much longer then the length of the synchronization data in the preamble field. The synchronization data is used to initially lock the voltage controlled oscillator in the phase locked loop to the phase and frequency of the synchronization data. The data in the data field is used to maintain the phase and frequency relationship between the clock and the phase and frequency of the data.

With the advent of digital processing of signals read from the magnetic media to recover the data encoded from the read signal, digital phase locked loops have been developed to digitally generate digital correction signals for correcting any phase or frequency error between the clock and the read data. At present data can be recorded at frequencies greater than the than the response time of the digital logic processing the read signals. Some digital data decoders therefore split the sequence of digital samples into a sequence of even numbered samples and a sequence of odd number samples. The even data bits recovered from the sequence of even samples were then combined with the odd data bits recovered from the sequence of odd samples to form the original sequence of data bits.

While the splitting of the data into sequences of even and odd samples has allowed data to be detected at half the clock frequency used to sample the analog signal, the information necessary for determining any phase or frequency error between the clock and the data was destroyed. The digital phase detectors needs more than one consecutive sample to obtain the relative frequency and phase error, if any, between the clock and the data and therefore has to be operated at the clock frequency used to sample the analog signal. Therefore the response time of the logic employed in the digital data phase detector remains as a major limiting factor of the overall response time of the digital phase locked loop.

SUMMARY OF THE INVENTION

Briefly, the present invention provides a digital phase detector that stores four sequential digital samples in a shift register. The contents of the shift register is evaluated at one half the clock frequency. The digital phase detector predicts the values for each of the two middle samples in the shift register. The predicted value and the actual value of each middle are used to generated a correction signal. The two generated correction signals for the two middle samples are then added to produce a total correction signal which is to be used in controlling the phase and frequency of to the voltage controlled oscillator in the phase locked loop.

An advantage of the invention is that the digital data phase detector and the digital data detectors can both be operated at one half the clock frequency used to sample the analog signal thereby allowing the digital phase locked loops to be used with higher data frequencies without requiring improvement in the response time of the logic used in the phase locked loop.

BRIEF DESCRIPTION OF THE DRAWINGS

The invention will be described with respect to the particular embodiments thereof and reference will be made to the drawings, in which:

FIG. 3 is a chart showing the sequences of predicted sample values used in generating a correction signal, the slope associated with each sequence, the logic statement used to test each sequence, the logic element of FIG. 5 which implements each logic statement, the formula for generating the correction value for each sequence and the logic element of FIG. 5 that generates the correction value in accordance with the formula from each sequence;

DETAILED DESCRIPTION OF THE INVENTION

A digital phase locked loop which could employ the digital data phase detector of this invention is fully described and discussed in the cross reference patent application entitled "APPARATUS AND METHOD FOR CONTROLLING THE FREQUENCY AT WHICH DATA IS WRITTEN IN A DISK DRIVE SYSTEM". The digital data phase detector of this invention could be used as the data digital phase detector 36 of FIG. 2 of this cross referenced patent application.

Figure 2:
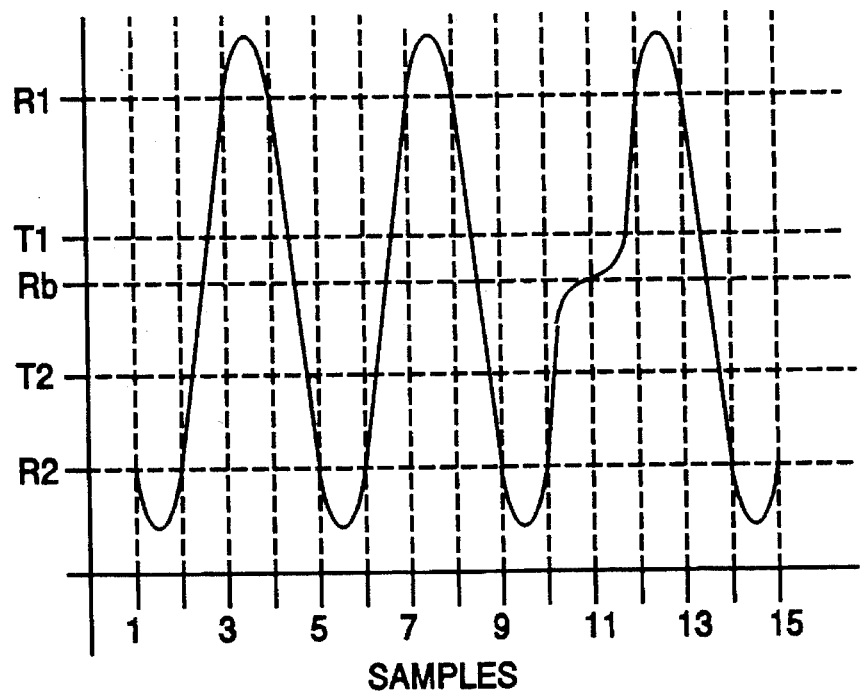
FIG. 2 is a diagram illustrating the waveform of a signal read from the magnetic media which embodies encoded data.

FIG. 2 is an illustration of a typical analog signal read from the magnetic media. Prior to the sampling of the analog signal by one or more analog to digital convertors, the analog signal is processed to have a baseline value of Rb such that the samples will have a value of R1, Rb or R2 if the phase and frequency of the clock is the same as the data. One such apparatus that performs such processing is disclosed in the crossed referenced patent application entitled "APPARATUS FOR COMPENSATING FOR NON-LINEAR CHARACTERISTICS OF MAGNETORESISTIVE HEADS".

In many system that employ a digital phase locked loop, the clock is square wave whose rising edge is used to initiate the sampling of the analog signal to obtain a digital sample.

FIG. 2 also shows 15 samples of the analog waveform taken in the sequence of S1, S2, S3, S4, S5, S6, S7, S8, S9, S10, S11, S12, S13, S14 and S15 with values of R2, R2, R1, R1, R2, R2, R1, R1, R2, R2, Rb, R1, R1, R2 and R2 respectively.

Assuming that an encoding scheme encoded the data such that a transition occurred in the magnetic field of the magnetic media whenever a binary 1 occurred in the data stream to be recorded. The sequence of binary bits encoded in the analog waveform would be 1, 0, 1, 0, 1, 0, 1, 0, 1, 0, 0, 1, 0, 1 and 0.

Figure 1:
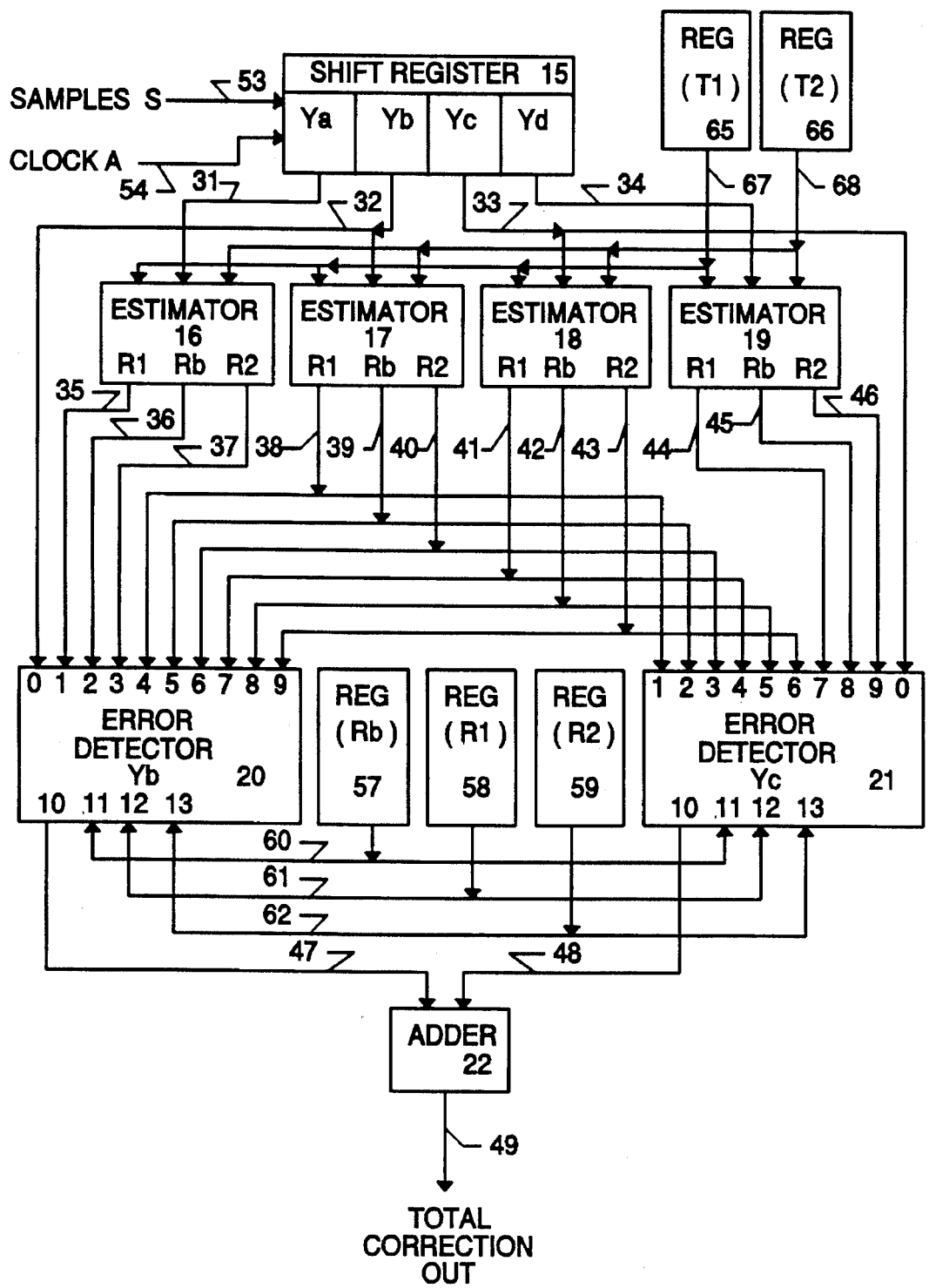
FIG. 1 is a block diagram of the digital data phase detector of the invention.

FIG. 1 shows a block diagram of the digital phase detector of the invention. The digital sample S generated during each clock period is presented via line 53 to shift register 15 for storage. Shift register 15 has four stages, Ya, Yb, Yc and Yd, for storing the value of four consecutive digital samples. The contents of shift register 15 is made available estimators 16, 17, 18, and 19 every cycle of clock A on line 54. Clock A is obtained by dividing in half the clock provided by the phase locked loop.

Table A demonstrates the contents of shift register 15 and which samples will be evaluated during consecutive clock A periods.

TABLE A

| Clock A Period | Shift Register 15 | | | | Evalu. | |
|---|---|---|---|---|---|---|
| | Ya | Yb | Yc | Yd | Yb | Yc |
| 1 | S2 | S1 | | | S1 | |
| 2 | S4 | S3 | S2 | S1 | S3 | S2 |
| 3 | S6 | S5 | S4 | S3 | S5 | S4 |
| 4 | S8 | S7 | S6 | S5 | S7 | S6 |
| 5 | S10 | S9 | S8 | S7 | S9 | S8 |
| 6 | S12 | S11 | S10 | S9 | S11 | S10 |
| 7 | S14 | S13 | S12 | S11 | S13 | S12 |

Table A shows the order in which samples are shifted through the shift register 15 and that each samples will be effectively evaluated in the sequence that the samples are stored in shift register 15. It should be noted that each stage of shift register 15 stores a multi bit positive or negative binary number.

Estimators 16, 17, 18 and 19 each generates a predicted value for the sample received from stages Ya, Yb, Yc or Yd respectively via buses 31, 32, 33 or 34 respectively. The predicted value is that value which the sample should have had, R1, Rb or R2, if the phase and frequency of the clock and the data are the same. Two threshold values T1 and T2 are stored in registers 65 and 66 respectively and are provider to each of the estimators 16, 17, 18 and 19 via buses 67 and 68 respectively. FIG. 2 illustrates that threshold value T1 has a value between the value of Rb and R1 and that threshold value T2 has a value between the value of Rb and R2. Each estimator 16, 17, 18 and 19 has three outputs labeled R1, Rb and R2, one output will be high and the remaining two outputs will be low during any given period of clock A.

Figure 4:
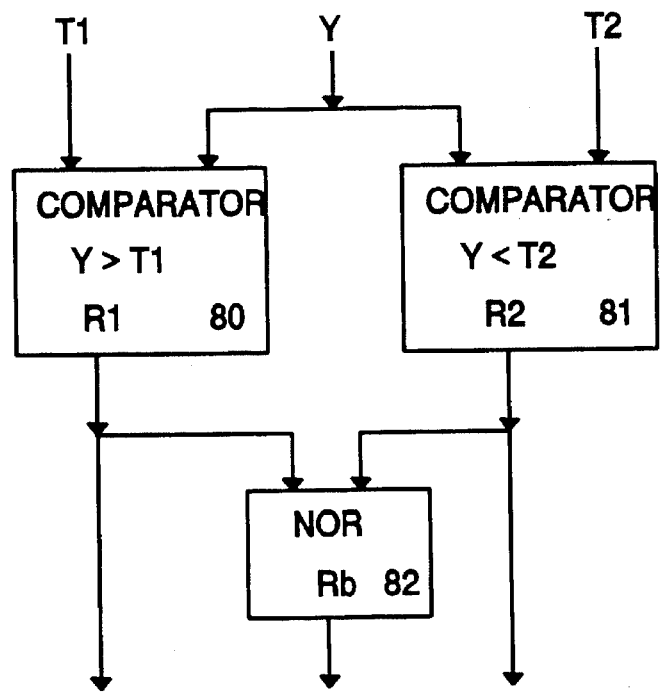
FIG. 4 is a logic diagram for the estimators shown in FIG. 1.

Referring to FIG. 4, each of the estimators 16, 17, 18 and 19 is comprised of comparators 80 and 81 and NOR 82. Comparator 80 generates the output labeled R1 which will be high only when the value of the sample received from the stage Y of shift register 15 has a value greater than threshold value T1. Comparator 81 generates the output labeled R2 which will be high only when the value of the sample received from the stage Y of shift register 15 has a value less than threshold value T2. NOR 82 generates the output labeled Rb which will be high only when both of the outputs labeled R1 and R2 are low, that is when the value of the sample in stage Y is equal to or less than the threshold value T1 and is equal to or greater than the threshold value T2.

Error detector 20 generates a correction signal at terminal 10 which is provided to adder 22 via bus 47. The correction signal is indicative of the magnitude and the direction of the error between the phase of the clock and the data encoded in the analog signal. The correction signal is derived from the value of the sample stored in stage Yb received via bus 32 at terminal 0. The sign of the correction signal is obtained from the slope of the analog signal when the sample stored in stage Yb was obtained from the analog signal. The slope is determined from the sequence of predicted values established by the raised output of estimators 16, 17 and 18. The three outputs from estimators 16, 17 and 18 via buses 35, 36, 37, 38, 39, 40, 41, 42 and 43 respectively are received at terminal 1, 2, 3, 4, 5, 6, 7, 8 and 9 respectively. The values for Rb, R1 and R2 are stored in registers 57, 58 and 59 and are provide to error detector 20 via buses 60, 61 and 62 at terminals 11, 12 and 13 respectively.

Error detector 21 generates a correction signal at terminal 10 which is provided to adder 22 via bus 48. The correction signal is indicative of the magnitude and the direction of the error between the phase of the clock and the data encoded in the analog signal. The correction signal is derived from the value of the sample stored in stage Yc received via bus 33 at terminal 0. The sign of the correction signal is obtained from the slope of the analog signal when the sample stored in stage Yb was obtained from the analog signal. The slope is determined from the sequence of predicted values established by the raised output of estimators 17, 18 and 19. The three outputs from estimators 17, 18 and 19 via buses 38, 39, 40, 41, 42, 43, 44, 45 and 46 respectively are received at terminal 1, 2, 3, 4, 5, 6, 7, 8 and 9 respectively. The values for Rb, R1 and R2 are stored in registers 57, 58 and 59 and are provide to error detector 21 via buses 60, 61 and 62 at terminals 11, 12 and 13 respectively.

Figure 5:
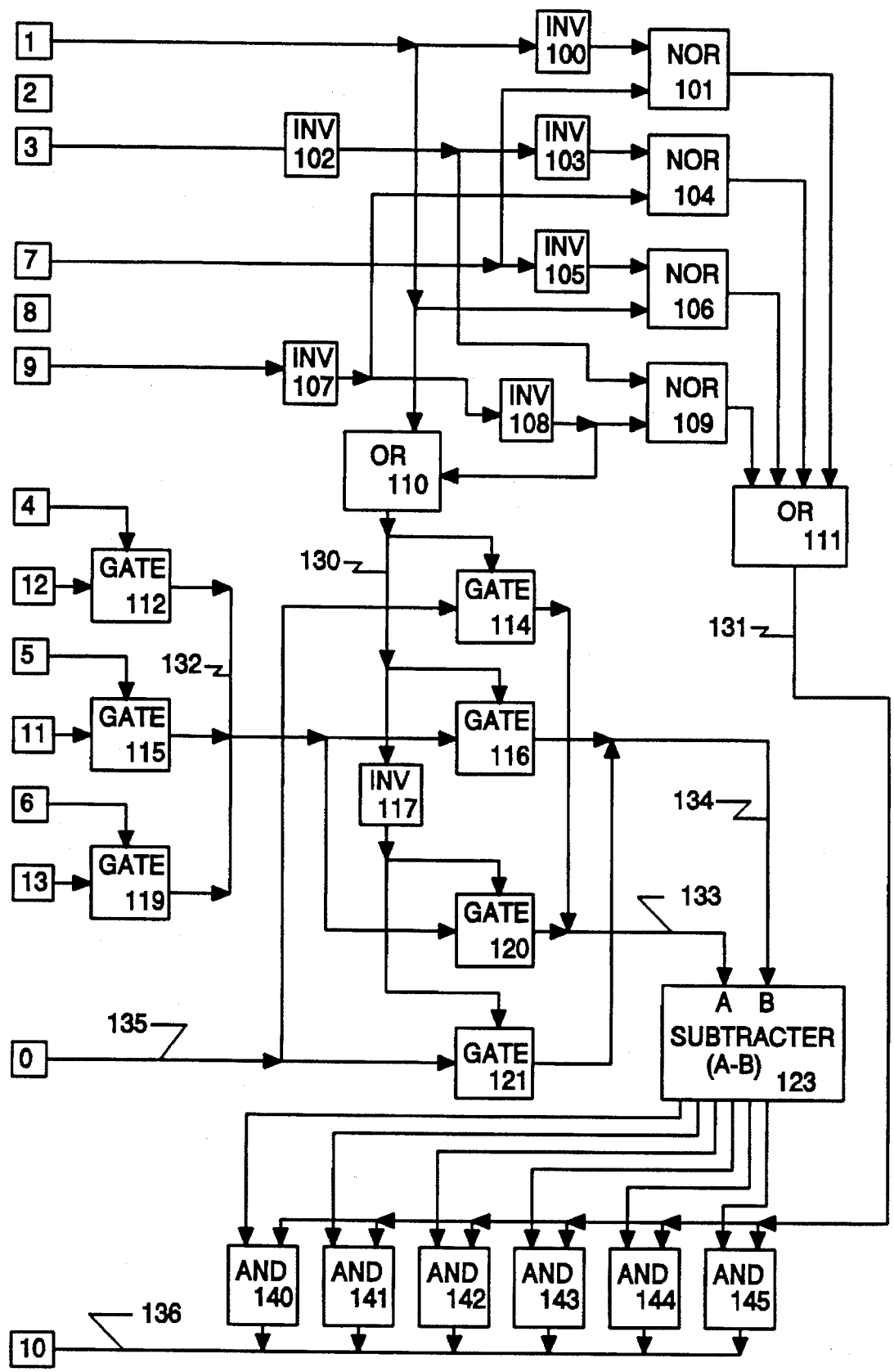
FIG. 5 is a logic diagram for the error detectors shown in FIG. 1.

FIGS. 5 shows the logic included within error detectors 20 and 21. FIG. 3 is a chart showing the sequences of predicted sample values which can be used in generating a correction signal, the slope associated with each sequence, the encoded value for each sequence, the logic element of FIG. 5 which tests for each sequence and the formula for generating the correction value for each sequence.

Commonly used values are 1 for R1, 0 for Rb and −1 for R2 and are so used in FIG. 3 and in the discussion of the operation of error detectors 20 and 21. The sequence of 0 1 1 in the sequence column indicates that the predicted value for the sample in stage Ya is 0 and therefore the output Rb of estimator 16 is raised, the predicted value for the sample in stage Yb is 1 and therefore the output R1 of estimator 17 is raised and the predicted value for the sample in stage Yc is 1 and therefore the output R1 of estimator 17 is raised.

Slope information can be obtained from the sequences listed in the sequence column of FIG. 3. Those sequences not listed do not provided sufficient information to derive the slope of the analog signal such that the sign for any correction value can reliably be determined and therefore a correction value of 0 is generated for those sequences.

Referring to FIG. 2, if the phase of the clock lags the phase of the data, that is the clock is running slow, then the analog waveform would be shifted to the left. Using for example the samples S2, S3, S4 and S5, such a shift to the left results in the sample value for samples S2 and S3 on the positive slope being more positive than R2 and R1 respectively and the sample value for samples S4 and S5 on the negative slope being less positive than R1 and R2 respectively. The correction value is obtained on the positive slope by subtracting from the measured sample value the predicted sample value, that is either R1, Rb or R2, for that measured sample value and on the negative slope by subtracting the measured sample value from the predicted sample value, that is either R1, Rb or R2, for that measured sample value. The resulting correction value will have positive sign which causes the voltage controlled oscillator in the digital phase locked loop to increase in frequency thereby effectively moving the analog signal to the right.

Conversely, if the phase of the clock leads the phase of the data, that is the clock is running fast, then the analog waveform would be shifted to the right. Using for example the samples S2, S3, S4 and S5, such a shift to the right results in the sample value for samples S2 and S3 on the positive slope being less positive than R2 and R1 respectively and the sample value for samples S4 and S5 on the negative slope being more positive than R1 and R2 respectively. The correction value is obtained on the positive slope by subtracting from the measured sample value the predicted sample value, that is either R1, Rb or R2, for that measured sample value and on the negative slope by subtracting the measured sample value from the predicted sample value, that is either R1, Rb or R2, for that measured sample value. The correction value will have a negative sign which causes the voltage controlled oscillator in the digital phase locked loop to decrease in frequency thereby effectively moving the analog signal to the left.

It should be remembered that the samples can be either a positive or negative number and that the value of R2 is a normally a negative number.

As can be seen in FIG. 3, the measured sample value Y for all sequences having a negative slope is subtracted from the predicted value Yb for the sequence of Ya Yb Yc or from the predicted value Yc for the sequence of Yb Yc Yd to obtain the correction value for the voltage controlled oscillator. In like manner for all sequences having a positive slope, the predicted value Yb for the sequence of Ya Yb Yc or the predicted value Yc for the sequence of Yb Yc Yd is subtracted from the measured sample value Y to obtain the correction value for the voltage controlled oscillator.

The calculations for obtaining the magnitude and sign for the correction value for a measured sample value Y where R1 is a positive number, Rb is equal to zero and R2 is a negative number, are as follows:

Y−R1 if the slope is positive and the predicted value is R1;

Y−R2 if the slope is positive and the predicted value is R2;

Y−Rb if the slope is positive and the predicted value is Rb;

R1−Y if the slope is negative and the predicted value is R1;

R2−Y if the slope is negative and the predicted value is R2; and

Rb−Y if the slope is negative and the predicted value is Rb.

Referring to FIG. 5, the logic of error detector 21 will be discussed with Rb=0, R1=1 and R2=−1 and in conjunction with the subject matter presented in FIG. 3. Error detector 20 will not be discussed since the operation of error detector 20 is the same as the operation of error detector 21 except for the source of the inputs at terminal 0–9.

A raise output will be designated as a 1 and a low output will be designated as a 0. The predicted values generated by each estimator is encoded into two bits M and L as set forth in the following truth table:

|        | M | L |
|--------|---|---|
| R1 (1) | 1 | 1 |
| Rb (0) | 0 | 1 |
| R2 (−1)| 0 | 0 |

The encoding is obtained by using the output R1 as bit M and the inverted output of R2 as bit L for each of the estimators used in determining the slope and if a valid sequence for providing a valid correction value is present in stages Yb, Yc and Yd of shift register 15. Inverter 102 inverts the R2 output from estimator 17 appearing at terminal 3 of error detector 21. Inverter 107 inverts the R2 output from estimator 19 appearing at terminal 9 of error detector 21.

It is only necessary to investigate the first and third sample values of a sequence in order to determine the slope of the sequence and whether the sequence is a valid sequence. Referring to FIG. 3, the ENCODED column set forth the encode value for bit Md and Ld for the first predicted value Yd and the encoded value for Mb and Lb for the third predict value Yb for each sequence listed in the SEQUENCE column. The value of Mb will be a 0 and the value of Ld will be a 1 only when there is a negative slope. Referring to FIG. 5, the slope is determined by OR 110 which will have an output value on line 130 of a 1 when the slope is positive and an output value of a 0 when the slope is negative.

Inverters 100, 103, 105 and 108 and NORs 101, 104, 106 and 109 form a detector that will provide a 1 to OR 111 only when a sequence shown in the SEQUENCE column of FIG. 3 is being processed which in turn will then provide a 1 on line 131.

The predicted value Yc as determined by estimator 18 is provided on bus 132. Transmission gate 112 will pass the value of 1 (R1) at terminal 12 from register (R1) 58 onto bus 132 if the R1 output received at terminal 4 from estimator 18 is a 1. Transmission gate 115 will pass the value of 0 (Rb) at terminal 11 from register (Rb) 57 onto bus 132 if the Rb output received at terminal 5 from of estimator 18 is a 1. Transmission gate 119 will pass the value of −1 (R2) at terminal 13 from register (R2) 59 onto bus 132 if the R2 output received at terminal 6 from of estimator 18 is a 1. Therefore the proper predicted value will be present on bus 132 for the calculation of the correction value. The sample value Y stored in stage Yc of shift register 15 is transferred from bus 33 at terminal 0 to bus 135 within decoder 21.

When the output of OR 110 is a 1 (positive slope) the sample value Y on bus 135 will pass through transmission gate 114 onto bus 133 to input A of subtractor 123 and the predicted value on bus 132 will pass through transmission gate 116 onto bus 134 to input B of subtractor 123. When the output of OR 110 is a 0 (negative slope) the sample value Y on bus 135 will pass through transmission gate 121 onto bus 134 to input B of subtractor 123 and the predicted value on bus 132 will pass through transmission gate 120 onto bus 133 to input A of subtractor 123.

Subtractor 123 performs the function of A-B. Which digital values are received at input A and input B of subtractor 123 is determined by the slope of the sequence thereby allowing the correction calculation, shown in the CORRECTION CALCULATION column of FIG. 3, to be performed.

Each of the six binary bits of the correction value provided at the output of subtractor 123 is connected to one of the ANDs 140–145. When the output of OR 111 is a 1, indicating a valid sequence, the outputs of ANDs 140–145 will be equal to the correction value of subtractor 123. When the output of OR 111 is a 0, indicating a invalid sequence, the outputs of ANDs 140–145 will be a correction value equal to zero. The outputs of ANDs 140–145 are connect to bus 136 which exits error detector 20 at terminal 10 and continues on via bus 47 to adder 22. In a similar manner, for each cycle of operation, error detector 21 will provide a correction value on bus 48 to adder 22. While the subtractor 123 of error detector 20 is shown to have an output containing six binary bits, it is well understood by those skilled in the art that the number of binary bit in the output of subtractor 123 is not limited to six but rather will be defined by the designer of the specific embodiment of the invention to met the specific requirements of the designer.

Adder 22 algebraically adds together the two correction values to generate a total correction value and places the total correction value on bus 49 for use in the phase locked loop to control the phase of the voltage controlled oscillator.

Effectively the digital phase detector provides a total correction value every other clock cycle thereby allowing the digital phase detector to operate at one half the clock frequency while deriving phase information from each sample which are generated at he clock frequency.

There are many logic configuration that can be designed to detect the slope and the validity of the sequence other than the preferred logic included in error detector 21 described herein.

While the invention has been particularly shown and described with reference to the described embodiment therefore, it will be understood by those skilled in the art that changes in form and detail may be made therein without departing from the spirit and scope of the invention. Given the above disclosure of general concepts and specific embodiments, the scope of the protection sought is defined by the following.

What is claimed is:

1. A digital phase detector for receiving a sequence of digital samples generated from an analog signal in responses to a clock having a clock frequency, said digital phase detector comprising:

storage means for storing, during each cycle of operation of said digital phase detector, a sequence of a first, second, third and fourth digital sample from said sequence of digital samples;

correction means connected to said storage means for generating a total correction value from the algebraic sum of a first correction value generated from said second digital sample and a second correction value generated from said third digital sample, said first and second correction values being generated in parallel wherein said digital phase detector operates at a frequency equal to one half of said clock frequency.

2. The digital phase detector of claim 1 wherein said clock comprises:

a voltage controlled oscillator in a digital phase locked loop where said clock frequency of said voltage controlled oscillator is a function of said total correction value generated by said correction means.

3. The digital phase detector of claim 1 wherein:

said storage means, after the generation of said total correction value during a cycle of operation, receives and stores a fifth and sixth digital sample from said sequence of digital samples where said fifth and sixth digital sample immediately follows said first, second and third and fourth digital samples in said sequence of digital samples, wherein after said fifth and sixth digital samples are store in said storage means:

said third generated digital sample now becomes said first digital sample stored in said storage means, said fourth generated digital sample now becomes said second digital sample now stored in said storage means, said fifth digital sample now becomes said third digital sample stored in said storage means, said sixth digital sample now becomes said fourth digital sample now stored in said storage means, and wherein said digital phase detector evaluated each digital sample in said sequence of digital samples for providing either a first correction value or a second correction value.

4. The digital phase detector of claim 1 wherein said correction means comprises:

control means for generating control signals as a function of said first, second, third and fourth digital samples stored in said storage means; and phase detection means for generating said first correction value and said second correction value in response to said control signals and said second and third digital samples stored in said storage means.

5. The digital phase detector of claim 4 wherein said phase detection means comprises:

third means for generating a predicted second digital sample from said second digital sample and a predicted third digital sample from said third digital sample;

fourth means for generating in response to said control signals generated by said control means said first correction value from said second digital sample and said predicted second digital sample and said second correction value from said third digital sample and said predicted third digital sample.

6. The digital phase detector of claim 5 wherein said phase detection means further comprises:

an adder for algebraically adding said first correction value and said second correction value to form said total correction value.

7. The digital phase detector of claim 4 wherein said control means comprises:

first means for generating a first slope signal and a first valid sequence signal as a function of said first, second and third digital samples; and second means for generating a second slope signal and a second valid sequence signal as a function of said second, third and fourth digital samples.

8. The digital phase detector of claim 7 wherein said phase detection means comprises:

third means for generating a predicted second digital sample from said second digital sample and a predicted third digital sample from said third digital sample;

fourth means in response to said first slope signal generating a first intermediate correction value from said second digital sample and said predicted second digital sample and in response to said second slope signal generating a second intermediate correction value from said third digital sample and said predicted third digital sample;

fifth means for generating a third correction value; and sixth means in response to said first valid sequence signal selecting either said first intermediate correction value or said third correction value as said first correction value and in response to said second valid sequence signal selecting either said second intermediate correction value or said third correction value as said second correction value.

9. The digital phase detector of claim 8 wherein said phase detector means further comprises:

an adder for algebraically adding said first correction value and said second correction value to form said total correction value.

10. The digital phase detector of claim 9 further comprising:

first register for storing a digital value Rb where said value Rb is a value that would be expected for a digital sample when data encoded in said analog signal is in phase with said clock frequency;

second register for storing a digital value R1 where said value R1 is a value that would be expected for a generated digital sample when data encoded in said analog signal is in phase with said clock frequency;

third register for storing a digital value R2 where said value R2 is a value that would be expected for a generated digital sample when data encoded in said analog signal is in phase with said clock frequency;

fourth register for storing a first digital threshold value T1 where R1>T1>Rb; and fifth register for storing a second digital threshold value T2 where Rb>T2>T2.

11. The digital phase detector of claim 10 wherein said third means comprises:

first selecting means for selecting, as said first predicted value as a function of said second digital sample S2, said value Rb when said T1>S2>T2, said value R1 when S2>T1 and said value R2 when S2<T2; and second selecting means for selecting, as said second predicted value as a function of said third digital sample S3, said value Rb when said T1>S3>T2, said value R1 when S3>T1 and said value R2 when S3<T2.

12. The digital phase detector of claim 10 wherein said control means comprises:

estimator means for generating for each digital sample S stored in said storage means a first signal when S>T1, a second signal when S<T2 and a third signal when T1<S>T2;

first generating means for generating from said first, second and third signals of said estimator for said first and third digital sample stored in said storage means said first slope signal indicating a slope of said analog signal when said second digital sample was generated from said analog signal and said first valid sequence signal indicating the validity of said first intermediate correction value; and second generating means for generating from said first, second and third signals of said estimator for said second and fourth generated digital sample stored in said storage means said second slope signal indicating a slope of said analog signal when said third digital sample was generated from said analog signal and said second valid sequence signal indicating the validity of said second intermediate correction value.

13. The digital phase detector of claim 12 wherein said first generating means comprises:

first encoding means for encoding said first and second signals generated by said estimator for said first digital sample stored in said storage means into a first two bit code and encoding said first and second signals generated by said estimator for said third digital sample stored in said storage means into a second two bit code; and first decoding means for generating said first slope signal and said first valid sequence signal as a function of said first two bit code and said second two bit code generated by said first encoding means; and said second generating means comprises:

second encoding means for encoding said first and second signals generated by said estimator for said second digital sample stored in said storage means into a first two bit code and encoding said first and second signals generated by said estimator for said fourth digital sample stored in said storage means into a second two bit code; and second decoding means for generating said second slope signal and said second valid sequence signal as a function of said first two bit code and said second two bit code generated by said second encoding means.

* * * * *